US008854877B2

(12) United States Patent
Nagashima et al.

(10) Patent No.: US 8,854,877 B2
(45) Date of Patent: Oct. 7, 2014

(54) NONVOLATILE SEMICONDUCTOR MEMORY DEVICE AND METHOD OF REUSING SAME

(75) Inventors: Yuji Nagashima, Kanagawa (JP);
Bunsho Kuramori, Tokyo (JP);
Hiroyuki Tanikawa, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 125 days.

(21) Appl. No.: 13/179,206

(22) Filed: Jul. 8, 2011

(65) Prior Publication Data

US 2012/0014178 A1    Jan. 19, 2012

(30) Foreign Application Priority Data

Jul. 15, 2010    (JP) ................................. 2010-160486

(51) Int. Cl.
| | |
|---|---|
| *G11C 11/34* | (2006.01) |
| *G11C 8/06* | (2006.01) |
| *G11C 16/10* | (2006.01) |
| *G11C 16/04* | (2006.01) |
| *G11C 29/00* | (2006.01) |
| *G11C 17/14* | (2006.01) |

(52) U.S. Cl.
CPC ................ *G11C 8/06* (2013.01); *G11C 29/883* (2013.01); *G11C 17/146* (2013.01); *G11C 16/10* (2013.01); *G11C 16/0475* (2013.01); *G11C 16/0491* (2013.01)
USPC ..................................... 365/182; 365/230.01

(58) Field of Classification Search
USPC ................. 265/182, 230.01, 230.06
See application file for complete search history.

(56) References Cited

U.S. PATENT DOCUMENTS

| | | | |
|---|---|---|---|
| 2004/0205290 A1* | 10/2004 | Shinagawa et al. | ............ 711/103 |
| 2008/0165609 A1* | 7/2008 | Mittal et al. | ............ 365/230.03 |
| 2010/0020603 A1* | 1/2010 | Yuda | ........................ 365/185.03 |

FOREIGN PATENT DOCUMENTS

| | | |
|---|---|---|
| JP | 60-136999 | 7/1985 |
| JP | 07-220492 | 8/1995 |
| JP | 09-091971 A | 4/1997 |
| JP | 2006-294103 A | 10/2006 |
| JP | 2009-146008 A | 7/2009 |
| JP | 2010-027162 A | 2/2010 |

OTHER PUBLICATIONS

Japanese Office Action dated Dec. 3, 2013 with English Translation.

* cited by examiner

*Primary Examiner* — Huan Hoang
(74) *Attorney, Agent, or Firm* — Rabin & Berdo, P.C.

(57) ABSTRACT

A nonvolatile semiconductor memory device and a method of reusing the same that allow a good use of the semiconductor device without degrading characteristics even when reused. The semiconductor memory device comprises information holding means for holding information that indicates an operation mode of said memory cell array, a decoder for generating, to said memory cell array, a selection signal to designate at least a read address of said memory cell array in accordance with an address signal that comprises plural bits; and mode setting means for fixing a logical value of at least one bit of said plural bits of said address signal in accordance with the information held by said information holding means, and supplying said address signal, on which fixing of the logical value is effected, to said decoder.

19 Claims, 6 Drawing Sheets

NONVOLATILE SEMICONDUCTOR MEMORY DEVICE AND METHOD OF REUSING SAME

BACKGROUND OF THE INVENTION

1. Field of the Invention

The present invention relates to a nonvolatile semiconductor memory device which allows reusing and a method of reusing same.

2. Description of the Related Art

There is a known nonvolatile semiconductor memory device that has two charge accumulation portions in a memory cell, and has a memory capacity of two bits per memory cell, by storing logic data ("0" or "1") in each of the two charge accumulation portions (see Japanese Patent Kokai No. H09-91971 (Patent Literature 1) and Japanese Patent Kokai No. 2010-27162 (Patent Literature 2)). The memory cell used in this type of semiconductor memory device has an nMOSFET structure for example, and two charge accumulation portions spaced apart from each other are formed on the drain terminal side and the source terminal side respectively. Storing of data, one bit per charge accumulation portion, two bits per memory cell, can be performed by assigning a state that electric charge is accumulated in the charge accumulation portion to data "0" for example, and assigning a state that electric charge is not accumulated in the charge accumulation portion to data "1", for example.

Writing of data into or reading of data from the memory cell of this type and erasing of data are performed in the following method, for example.

When performing the writing of data "0" into the charge accumulation portion on the drain terminal side for example, a positive voltage is applied to the drain terminal and the gate terminal, and the source terminal is held at the ground voltage. Consequently, hot electrons are injected into the charge accumulating portion on the drain side and held therein, thereby writing of data "0" is performed.

Next, when reading the data stored in the charge accumulation portion on the drain terminal side, a positive voltage is applied to the source terminal and the gate terminal, and the drain terminal is held at the ground voltage. In this instance, a relatively large read current is obtained if electric charge is not accumulated in the charge accumulation portion on the drain terminal side, that is, data "1" is recorded in the charge accumulation portion on the drain terminal side. Conversely, if electric charge not accumulated in the charge accumulation portion on the drain terminal side, that is, data "0" is recorded in the charge accumulation portion on the drain terminal side, the read current becomes smaller relative to the current obtained when data "1" is recorded, due to the effect of the accumulated electric charge. Thus, a difference in magnitude of the read current appears depending on the presence/absence of electric charge in the charge accumulation portion, so that the reading of data can be performed by judging the largeness/smallness of the read current.

When erasing the data stored in the charge accumulation portion on the drain terminal side, a positive voltage is applied to the drain terminal, zero or a negative voltage is applied to the gate terminal, and the source terminal is held in an open state. Consequently, hot holes produced near the drain area are injected into the charge accumulation portion, and the data is erased by the neutralization of the electric charge accumulated in the charge accumulation portion.

There exists a use of writing a program to this type of semiconductor memory device and mounting the semiconductor memory device in an appliance. In some cases, the program may be repeatedly rewritten by a user as the need arises. In such event, security issues can arise as discussed in Japanese Patent Kokai No. 2009-146008 (Patent Literature 3).

To cope with the security issue, a shipping mode is conceivable in which data, e.g., a program, is written into an EEPROM (Electrically Erasable and Programmable Read Only Memory) of which the capability for writing is then limited. However, if such a memory device in which data is already written has remained unused by a user, the memory device will become just useless for the user.

Conventionally, in order to cope with a situation that such "useless" memory devices having data written beforehand remain unused and are maintained by a user, a business plan has been considered, that includes procedures of buying the unused memory devices from users, erasing data written on them, writing necessary data subsequently, and shipping them to users.

SUMMARY OF THE INVENTION

However, when adopting the memory structure having two charge accumulation portions provided in a memory cell, like the one disclosed in Patent Literature 2, there arise cases that it is not possible to get a good performance as that obtained at the time of the initial writing of data, due to a simple degradation in performance after the erasing. It is also recognized that the two charge accumulation portions become more susceptible to mutual interference due to degradation, since the writing is performed in each of the charge accumulation portions.

Thus, widespread growth of the business plan mentioned above is presently difficult because the circuit designing and the element designing are not preformed in ways to target the reuse.

The present invention has been made in view of the points described above, and it is therefore an object of the present invention to provide a nonvolatile semiconductor memory device that can be used in a preferable way without degradation of its performance after the reuse, and method of reusing same.

According to the present invention, there is provided a nonvolatile semiconductor memory device having a memory cell array arranged in matrix form, comprising: information holding means for holding information that indicates an operation mode of said memory cell array, a decoder for generating, to said memory cell array, a selection signal to designate at least a read address of said memory cell array in accordance with an address signal that comprises plural bits; and mode setting means for fixing a logical value of at least one bit of said plural bits of said address signal in accordance with the information held by said information holding means, and supplying said address signal, on which fixing of the logical value is effected, to said decoder.

According to the present invention, there is also provided a method for reusing a nonvolatile semiconductor memory having a plurality of memory cells, information holding means for indicating at least one of a used region and a unused region of said plurality of memory cells as holding information, and control means for rendering only said used region of said plurality of memory cells at least readable, in accordance with said holding information of said information holding means, said method comprising: a step for reading said holding information of said information holding means, a step of discriminating between said used region and said unused region of said plurality of memory cells in accordance with the holding information having been read; a step for erasing data of said used region of said plurality of memory cells, a step for altering said holding information of said information holding means to change said unused region of said plurality of memory cells to a used region, and a step for writing data into said unused region of said plurality of memory cells.

In accordance with the semiconductor memory device and the reusing method of the present invention, the semiconductor memory device can be used in a preferable way without degradation of its performance even when the semiconductor memory device is reused, since the region of the plurality of memory cells is used in a limited manner in accordance with the information held in the information holding means that indicates the operation mode of the memory cell array. For instance, in the case of a memory cell array which comprises a plurality of memory cells having a memory structure that each of the memory cells has two charge accumulation portions, the used region can be selectively set such that only one of the two charge accumulation portions constitutes the used region. Thus, interference between the two charge accumulation portions can be prevented in the memory cell array and the memory cell array can be used in a preferable way even when it is reused.

DETAILED DESCRIPTION OF THE PREFERRED EMBODIMENT

An embodiment of the present invention will be described below with reference to the accompanying drawings.

Figure 1:
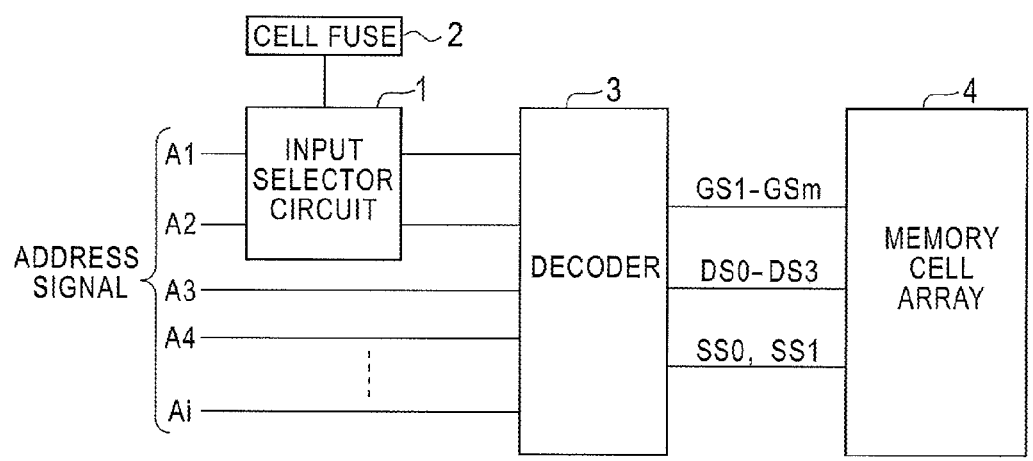
FIG. 1 is a block diagram showing a non-volatile semiconductor memory device according to the present invention.

FIG. 1 shows the structure of a non-volatile semiconductor memory device presented as the first embodiment of the present invention. The semiconductor memory device is provided with an input selector circuit 1, a cell fuse 2, a decoder 3, and a memory cell array 4. Two bits A1, A2 of the input address signal having i bits (A1 to Ai, where i is an integer equal to 3 or more) are supplied to the input selector circuit 1 to which the cell fuse 2 is connected. The cell fuse 2 constitutes an information holding means that comprises a nonvolatile memory device. Generally, the setting of erasure or alteration of the stored content of (the content held in) the cell fuse 2 is performed at the maker of the semiconductor memory device, and the setting operation is not made possible for the user. The input selector circuit 1 performs an initial setting of two bits A1, A2 of the address signal in accordance with the stored content of the cell fuse 2. As an initial setting, there are a first mode where A1 is "fixed" and A2 is "through", a second mode where A1 is "through" and A2 is "fixed", and a third mode where A1 is "fixed" and A2 is "fixed". With respect to the expression "fixed" in the mode described above, an operation is performed to fix, for example, the bit A1 in the first mode, to a high level that corresponds to logical "1" without respect to the input signal level thereof. In the case of the second mode, an operation to fix the bit A2 to the high level that corresponds to the logical "1" without respect to the input signal level thereof is performed. In the case of the third mode, an operation to fix both of the bits A1 and A2 to the high level that corresponds to the logical "1" without respect to the input signal levels thereof is performed.

The two bits A1 and A2 of the address signal are supplied to the decoder 3 from the input selector circuit 1. The remaining bits A3 to Ai of the address signal are supplied to the decoder 3 without passing through the input sector circuit 1. Alternatively, the remaining bits A3 to Ai of the address signal may be supplied to the decoder 3 without any change after passing through the input sector circuit 1. The decoder 3 generates selection signals DS0 to DS3, SS0, SS1, and GS1 to GSm of the memory cell array 4 in accordance with the address signal A1 to Ai. The selection signals DS0 to DS3, SS0 and SS1 are signals to select bit lines BL0, BL1, . . . BLk (BLk is not shown in the figure) of the memory cell array 4. The selection signals GS1 to GSm are signals to select word lines WL1 to WLm of the memory cell array 4. The letter k represents the number of columns of the memory cell portion 6 (the number of memory cells in the horizontal direction in FIG. 2) of the memory cell array 4 which will be described below. The letter m represents the number of rows of the memory cell portion 6 (the number of memory cells in the vertical direction in FIG. 2) of the memory cell array 4.

Figure 2:
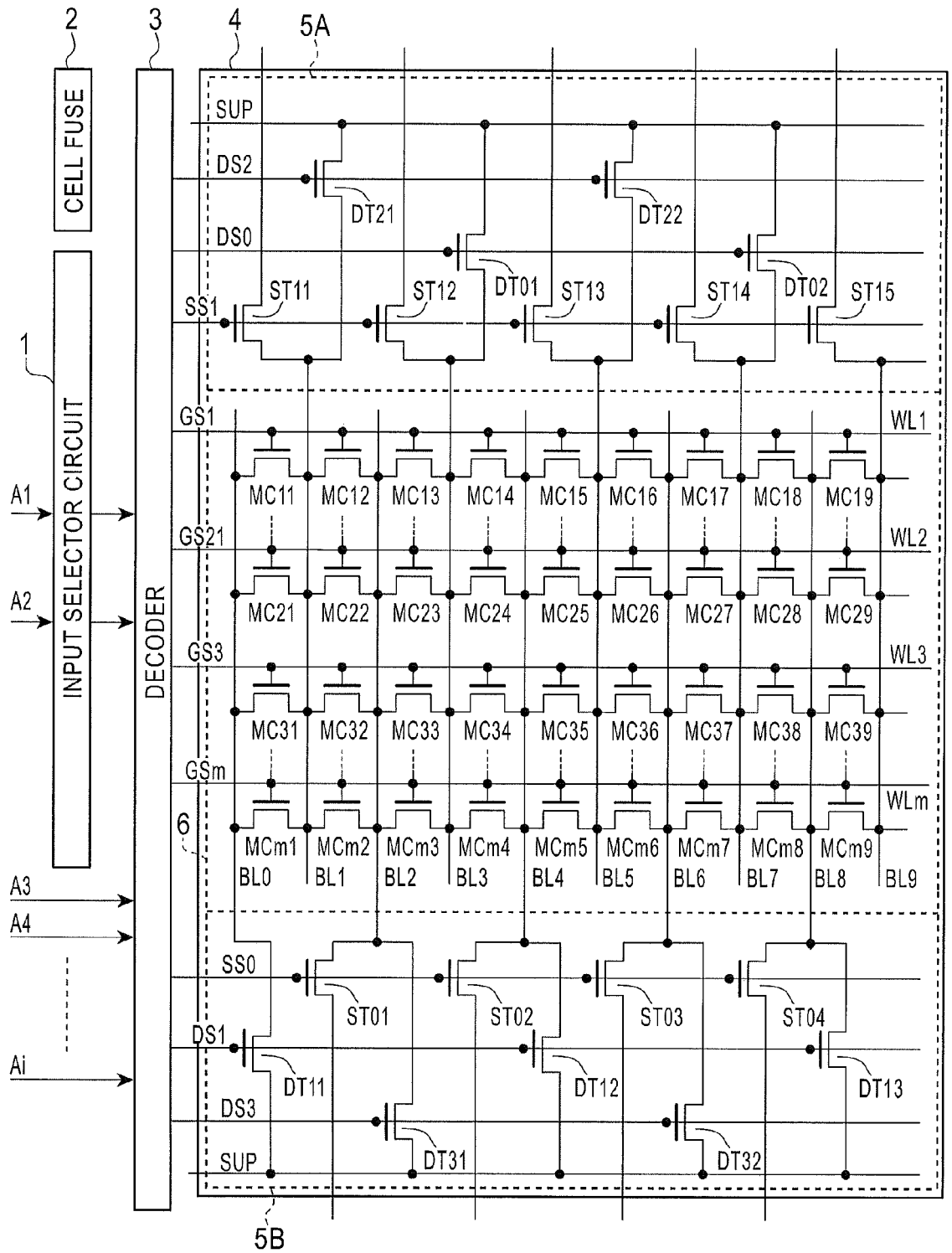
FIG. 2 is a circuit diagram showing the internal structure of the memory cell array in the device shown in FIG. 1.

As shown in FIG. 2, the memory cell array 4 comprises bit line selection portions 5A and 5B, and a cell array portion 6. The bit line selection portion 5A performs the selection of the even numbered lines of the bit lines BL in accordance with the selection signals DS0, DS2 and SS1 and the bit line selection portion 5B performs the selection of the odd numbered lines of the bit lines BL in accordance with the selection signals DS1, DS3 and SS0. The bit line selection portion 5A is provided with switching transistors DT01, DT02, . . . that are ON-OFF switched in accordance with the selection signal DS0, switching transistors DT21, DT22, . . . that are ON-OFF switched in accordance with the selection signal DS2, and switching transistors ST11, ST12, . . . that are ON-OFF switched in accordance with the selection signal SS1. The bit line selection portion 5B is provided with switching transistors DT11, DT12, . . . that are ON-OFF switched in accordance with the selection signal DS1, switching transistors DT31, DT32, . . . that are ON-OFF switched in accordance with the selection signal DS3, and switching transistors ST11, ST12, . . . that are ON-OFF switched in accordance with the selection signal SS0.

The drain of each of the transistors DT01, DT02, . . . , DT11, DT12, . . . , DT21, DT22, . . . , and DT31, DT32 . . . , is connected to the common power supply line SUP. The source of the transistor DT11 is connected to the bit line BL0, the drain of the transistor ST11 and the source of the transistor DT21 are connected to the bit line BL1, and the drain of the transistor ST01 and the source of the transistor DT31 are connected to the bit line BL2. Since the connection to each of the remaining bit lines is similar to the connections described above, the explanation is omitted.

The cell array portion 6 is made up of a plurality of memory cells MC11-MCmk (MCmk is not depicted in the drawing) that are arranged in matrix. Each of the memory cells MC11 to MCmk has an nMOSFET structure. The gate of each of the memory cells MC11 to MC1$k$ on the same row is connected to the word line WL1, the gate of each of the memory cells MC21 to MC2$k$ is connected to the word line WL2, . . . , and the gate of each of the memory cells MCm1 to MCmk is connected to the word line WLm. The drain terminal of each of the memory cells MC11 to MC1m on the same column is connected to the bit line BL0, the source terminal of each of the memory cells MC11 to MCm1 and the drain terminal of each of the memory cells MC12 to MCm2 are connected to the bit line BL1, . . . , and the source terminal of each of the memory cells MC1(k−1) to MCm(k−1) and the drain terminal of each of the memory cells MC1k to MCmk are connected to the bit line BL(k−1), and the source terminal of each of the memory cells MC1k to MCmk is connected to the bit line BLk.

The source of each of the transistors ST01, ST02, . . . and the transistors ST11, ST12, . . . constitutes a bit read line, and each line is connected to a sense latch circuit (not shown) for the current detection.

Figure 3:
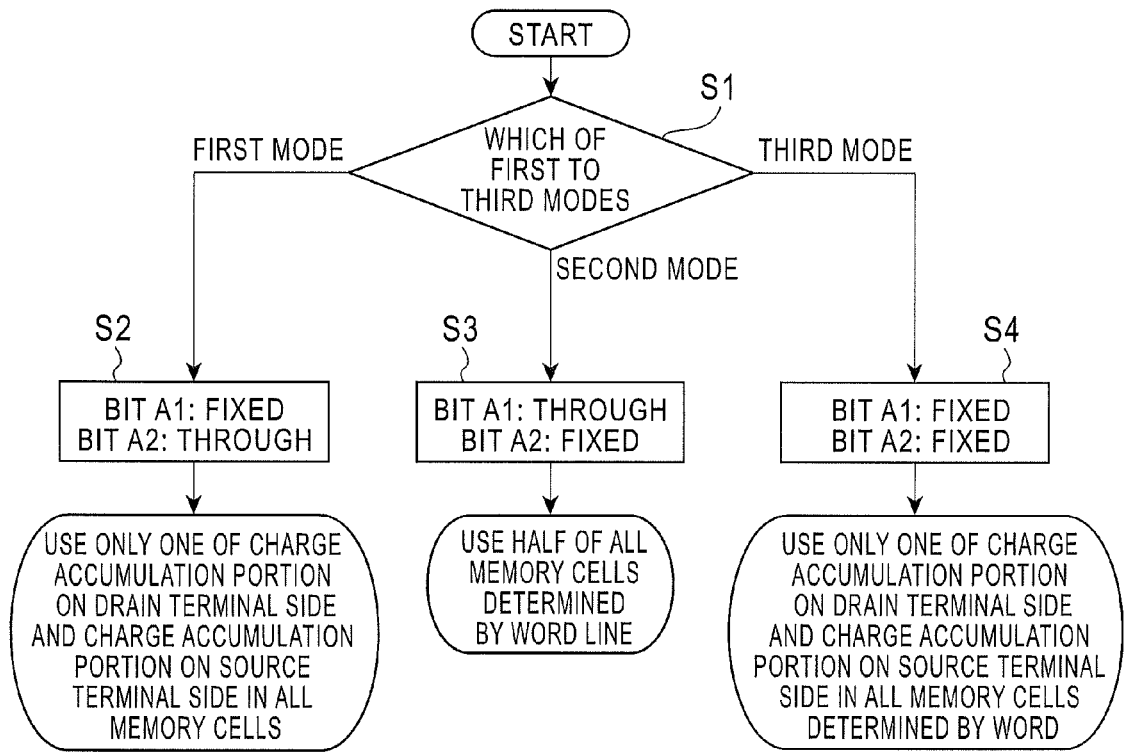
FIG. 3 is a flowchart showing the operation of the input selector circuit in the device shown in FIG. 1.
Figure 4:
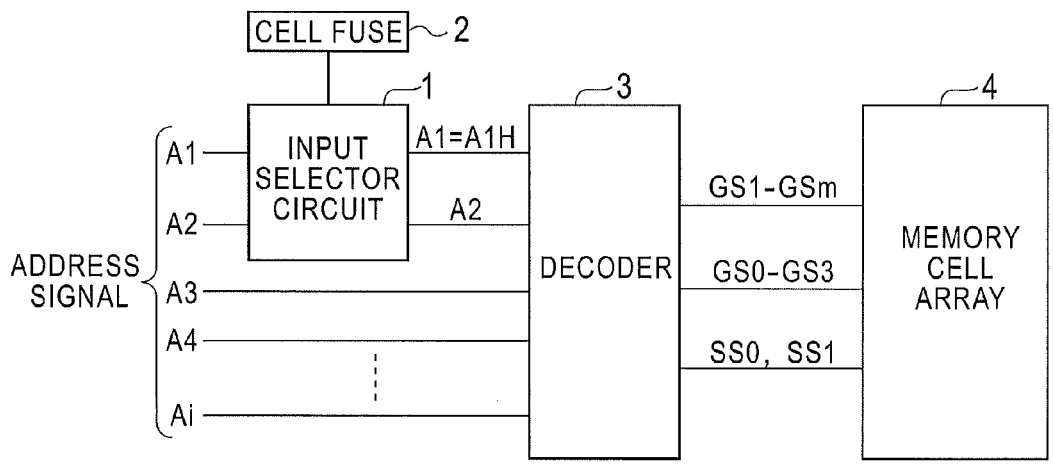
FIG. 4 is a diagram showing output bits A1, A2 of the input selector circuit in a first mode.

As shown in FIG. 3, the input selector circuit 1 in the semiconductor memory device having the structure described above makes a judgment, in accordance with the stored content of the cell fuse, as to which one of the first to third modes the initial setting is (Step S1). When the initial setting is judged to be the first mode in accordance with the stored content of the cell fuse 2, the input selector circuit 1 outputs the bit A1 of the address signal by fixing it, for example, to the high level AH1 that corresponds to the logical "1", and outputs the bit A2 without making any change as shown in FIG. 4 (Step S2). Thus, in the case of the semiconductor memory device initialized to the first mode, A1 input of the decoder 3 is fixed, and the selection signals DS0 to DS3, SS0, and SS1 are generated so that the charge accumulation portion (not shown) on either the drain terminal side or the source terminal side, of each of the memory cells MC11 to MCmk, is utilized for the memorization. In other words, all of the memory cells MC11 to MCmk are not used as the two-bit memory cell, but used as the one-bit memory cell that can memorize only one bit.

Figure 5:
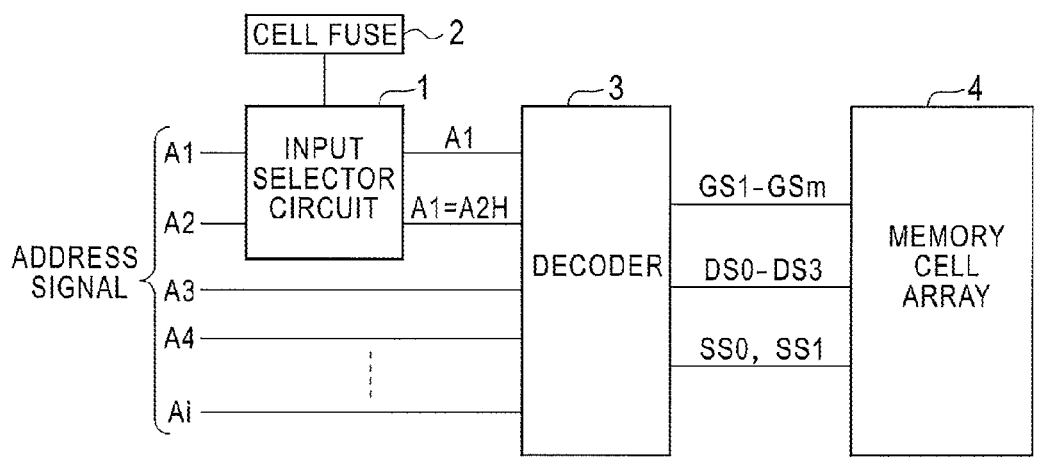
FIG. 5 is a diagram showing output bits A1, A2 of the input selector circuit in a second mode.
Figure 6:
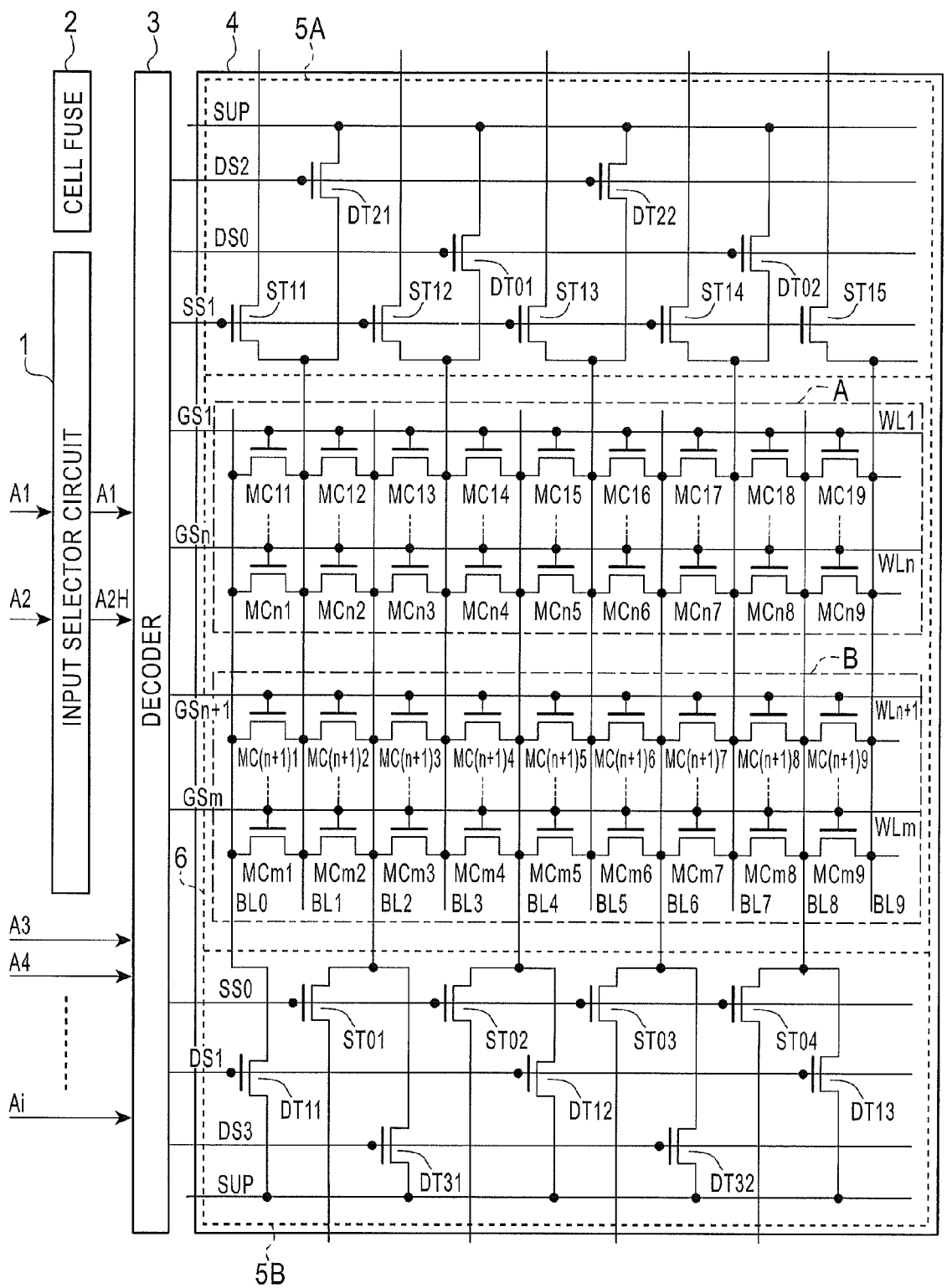
FIG. 6 is a diagram showing the two memory regions in the memory cell array in the second mode.

Next, when the initial setting is judged to be the second mode in accordance with the stored content of the cell fuse 2, the input selector circuit 1 outputs the bit A2 of the address signal by fixing it, for example, to the high level AH2 that corresponds to the logical "1", and outputs the bit A1 without making any change, as shown in FIG. 5 (Step S3). Thus, in the case of the semiconductor memory device initialized to the second mode, A2 input of the decoder 3 is fixed, and the selection signals GS1 to GSm are generated so that either the memory cells corresponding to the word lines WL1 to WLn (n is an integer equal to or greater than 1) or the memory cells corresponding to the word lines WL(n+1) to WLm are utilized for the memorization. Since m=2n, only half of all memory cells MC11 to MCmk are used as the two-bit memory cell, and the remaining half of the memory cells are not used at all. In other words, either one of the memory region corresponding to the word lines WL1 to WLn encircled by the one-dot chain line A and the memory region corresponding to the word lines WL(n+1) to WLm encircled by the one-dot chain line B is utilized as shown in FIG. 6. Determination as to which one of the memory regions is to be used is made in accordance with the stored content of the cell fuse 2.

Figure 7:
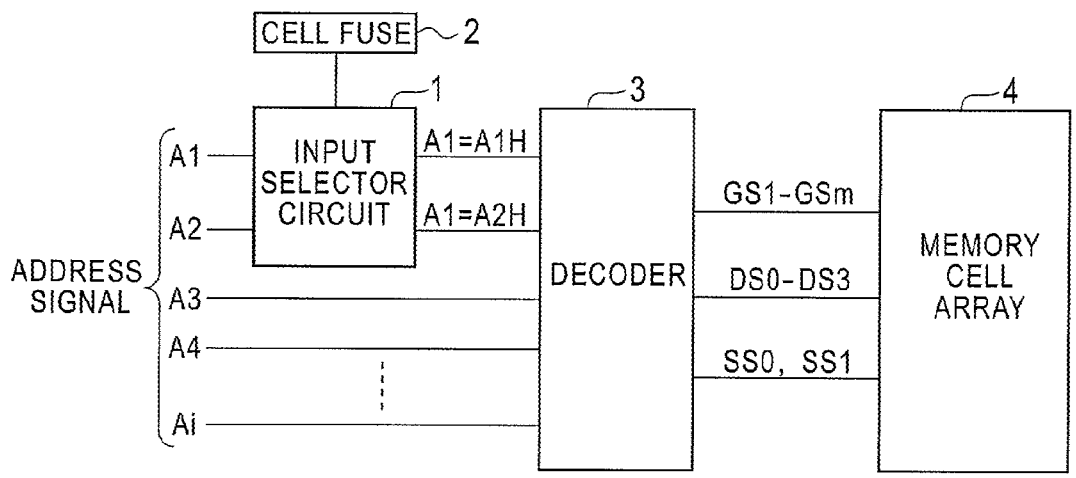
FIG. 7 is a diagram showing output bits A1, A2 of the input selector circuit in a third mode.

Furthermore, when the initial setting is judged to be the third mode in accordance with the stored content of the cell fuse 2, the input selector circuit 1 outputs the bit A1 of the address signal by fixing it, for example, to the high level AH1 that corresponds to the logical "1", and outputs the bit A2 by fixing it, for example, to the high level AH2 that corresponds to the logical "1", as shown in FIG. 7 (Step S3). Thus, in the case of the semiconductor memory device initialized to the third mode, A1 and A2 inputs of the decoder 3 are fixed, and the selection signals DS0 to DS3, SS0, and SS1 are generated so that the charge accumulation portion on either one of the drain terminal side and the source terminal side, of each of the memory cells MC11 to MCmk, is utilized for the memorization and the selection signals GS1 to GSm are generated so that either the memory cells corresponding to the word lines WL1 to WLn (n is an integer equal to or greater than 1) or the memory cells corresponding to the word lines WL(n+1) to WLm are utilized for the memorization. Since m=2n, only half of all memory cells MC11 to MCmk are used as the one-bit memory cell, and the remaining half of the memory cells are not used at all. With respect to the memory capacity, one fourth of the total memory capacity is made usable.

In the first mode described above, all memory cells MC11 to MCmk provided as the two-bit memory cells are used as the one-bit memory cells that employs either the charge accumulation portions on the drain terminal side or the charge accumulation portions on the drain terminal side, so that the current range can be expanded. Additionally, the judgment between the logical value "0" and the logical value "1" is facilitated, so that the yield rate of the memory device can be improved. Furthermore, the writing is performed in the way that electric charge is injected into only one of the charge accumulation portions of the memory cell, an interference which affects the amount of electric charge in the other charge accumulation portion, caused by the current leakage to the other charge accumulation portion in the case where both of the charge accumulation portions are used are surely prevented, and the confirmation of data during the writing is made unnecessary. Thus, a reduction of writing time can be enabled.

Furthermore, when each of the whole memory calls MC11 to MCmk is used as the one-bit memory cell which employs either one of the charge accumulation portion on the drain terminal side and the charge accumulation portion on the source terminal side, the memory device can be reused by erasing the memory data written through its use as the one-bit memory cell and changing the stored content of the cell fuse, in the manner that the one-bit memory cell is formed by the other one of the charge accumulation portion on the drain terminal side and the charge accumulation portion on the source terminal side. Thus, rewriting of the written data is enabled at least once.

In the second mode described above, cell array portion 6 of the memory device is used in the state of being halved, so that the memory cells are divided into the used memory cells and unused memory cells. Accordingly, rewriting of data can be performed at least once by changing the stored content of the cell fuse 2 and using the unused memory cells.

In the third mode described above, only one fourth of the memory capacity is used, Accordingly, rewriting of data can be performed at least three times because the used region can be shifted three times by changing the stored content of the cell fuse 2. As in the case of the first mode, either the charge accumulation portion of the drain terminal side or the charge accumulation portion of the source terminal side can be individually used as the one-bit memory cell, so that the current range can be expanded. As a result of expansion of the current range, the judgment between the logical value "0" and the logical value "1" is facilitated, so that the yield rate of the memory device can be improved. Furthermore, the writing is performed in the way that electric charge is injected into only one of the charge accumulation portions of the memory cell, the interference between the two charge accumulation portions is surely prevented, and a single writing operation is sufficient to complete the writing. Thus, the writing time period can be shortened.

Although the embodiment described above consists of a nonvolatile semiconductor memory device provided with two-bit memory cells, the present invention is also applicable to a nonvolatile memory device having other type of multi-bit type memory cell such as a four-bit type memory cell. Further, if the setting is limitedly performed to the memory cell region to be used, like in the second mode described above, the present invention is applicable to a nonvolatile semiconductor memory device having single bit memory cells.

With respect to the cell fuse 2 of the embodiment described above, two types of the stored content exist for the first mode in order to designate one of the charge accumulation portions of the memory cell to be used. For the second mode, two types of the stored content exist to designate the memory cell region. For the third mode, four types of the stored content exist to designate one of the charge accumulation portions of the memory cell to be used, and to designate the memory cell region. It is desirable that the input selector circuit 1 is configured to be able to judge between the eight types of stored content of the cell fuse 2.

In the embodiment described above, the device is configured that the logical value of one bit among the plural bits that constitute the address signal is fixed. However, this is not limitative, and the device may be configured that logical values of more than one bit are fixed. Furthermore, in the second mode, memory cells of one half of all memory cells are used, and memory cells of the remaining half of all memory cells are set to be unused. However, this is not limitative. For instance, according to the present invention, the device can be configured that memory cells of one third of all memory cells are used and memory cells of the remaining two thirds of all memory cells are set to be unused. In the third mode, the memory cells of one half of all memory cells are used, and memory cells of the remaining half of all memory cells are set to be unused. However, this is not limitative.

For instance, according to the present invention, the device can be configured that memory cells of one third of all memory cells are used and memory cells of the remaining two thirds of all memory cells are set to be unused.

In the embodiment described above, the first to third modes are provided as the initial setting. However it is possible to provide a fourth mode. When the fourth mode is set as an initial mode in accordance with the stored content of the cell fuse 2, the setting of the input selector circuit 1 is, that both of the bit A1 and the bit A2 are not fixed (A1: through, A2: through). Thus, in the fourth mode all of the memory cells MC11 to MCmk in the cell array portion 6 are used as two bit memory cell.

Furthermore, in the embodiment described above, the cell fuse 2 and the memory cell array 4 are separately provided. However, it is also possible to use a part of the memory cell array 4 as the cell fuse 2.

In the embodiment described above, the used region of the plurality of memory cells are set to be read-only. However, it is also possible to allow the writing and erasing in the used region. Although the cell fuse 2 in the described embodiment is rewritable, it is also admissible that the cell fuse is unrewritable.

Furthermore, the input selector circuit 1 can be fixed to one mode among the first to third mode. For instance, the input selector circuit 1 is exclusively used for the first mode.

Figure 8:
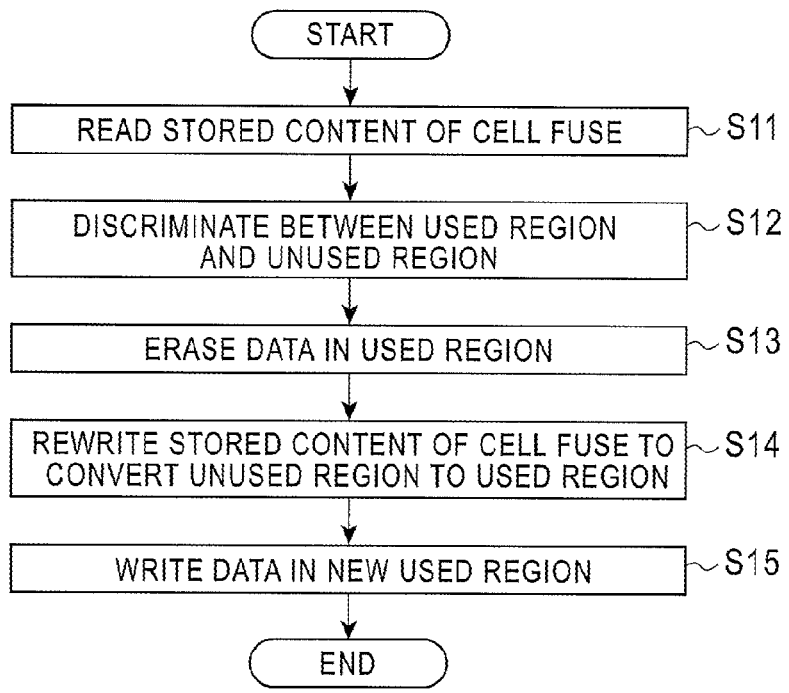
FIG. 8 is a flowchart showing the setting operation for reusing the memory device.

Furthermore, an external writing device (not shown) is used for a setting operation of the stored content of the cell fuse when the semiconductor memory device of the embodiment described above has been used in one of the first to third modes. In this setting operation, the external writing device first reads the stored content of the cell fuse 2 (step S11) as shown in FIG. 8. Then, the external device discriminates a unused region according to the stored content (operation mode) of the cell fuse 2 (step S12). That is, the current used region and the unused region are discriminated by the operation mode. In accordance with the operation mode having been judged, data in the current used region is erased (step S13), and the stored content of the cell fuse 2 is rewritten to convert the unused region to the used region (step S14). Then, information such as a program and/or data is written in the new used region (step S15). When the operation mode is the first mode, the other of the charge accumulation portions, as opposed to one of the charge accumulation portions that has been the used region, constitutes the unused region, and the other of the charge accumulation portions is set as the used region in step S14. If the stored content of the cell fuse 2 has been set, for example, so that the bit A1 of the address signal is fixed to the logical value "1", then the stored content is changed so that the bit A1 of the address signal is fixed to the logical value "0" in step S14. When the operation mode is the second mode, the remaining half of the memory cell region as opposed to the half of the whole memory cell region that constitutes the used region, constitutes the unused region, and the remaining half of the whole memory cell region is set as the used region in step S14. If the stored content of the cell fuse 2 has been set, for example, so that the bit A2 of the address signal is fixed to the logical value "1", then the stored content is changed so that the bit A2 of the address signal is fixed to the logical value "0" in step S14. When the operation mode is the third mode, the other of the charge accumulation portions of the half of the whole memory cell region, as opposed to one of the charge accumulation portions of the half of the whole memory cell region that has been the used region, constitute the unused region, and the other of the charge accumulation portions is set as the used region in step S14. If the stored content of the cell fuse 2 has been set, for example, so that the bit A1 and bit A2 of the address signal are both fixed to the logical value "1", then the stored content is changed so that the bit A1 and the bit A2 of the address signal are fixed to the logical value "0" in step S14. Additionally, when the operation mode is the third mode, as the unused region there also exist one of the charge accumulation portions of each memory cell in the remaining half of the whole memory cell region and the other of the charge accumulation portions of each memory cell in the remaining half of the whole memory cell region. The one or the other of these charge accumulation portions can be set as the new used region. As explained so far, the unused region of the plurality of memory cells is set as the new used region, and consequently the nonvolatile semiconductor memory device can be used in a preferable way without degrading its performance.

This application is based on Japanese Patent Application No. 2010-160486 which is herein incorporated by reference.

What is claimed is:

1. A nonvolatile semiconductor memory device having a memory cell array arranged in matrix form, comprising:
   a decoder for generating, to said memory cell array, a selection signal to designate at least a read address of said memory cell array in accordance with an address signal that comprises plural bits;
   an information holding part which holds information that indicates an one of a plurality of operation modes of said memory cell array; and
   a mode setting part which is adapted to select said one of the plurality of operation modes by fixing a logical value of at least one bit of a first bit and a second bit of said address signal in accordance with the information held by said information holding part, and supplying said address signal, on which fixing of the logical value is effected, to said decoder thereby to use said one of a plurality of operation modes, said first bit of said address signal carrying information for selecting one of a drain terminal side and a source terminal side of a plurality of memory cells of said memory cell array, and said second bit of said address signal carrying information for selecting one of a plurality of word lines of said memory cell array.

2. A nonvolatile semiconductor memory device as claimed in claim 1, wherein said memory array comprises:
the plurality of word lines;
the plurality of memory cells each having an nMOSFET structure and having a charge accumulation portion on each of the drain terminal side and the source terminal side, and a gate terminal connected to each of said word lines; and
a plurality of bit lines, and wherein data is recorded by injecting electric charges into said charge accumulation portion of each of said plurality of memory cells.

3. A nonvolatile semiconductor memory device as claimed in claim 2, wherein said mode setting part fixes a logical value of the first bit of plural bits of said address signal in accordance with information held in said information holding part, and said decoder generates said selection signal in a manner that connections relating to said bit lines are limited to use only one of said charge accumulation portion on said drain terminal side and said charge accumulation portion on said source terminal side in each of said plurality of memory cells.

4. A nonvolatile semiconductor memory device as claimed in claim 2, wherein said mode setting part fixes a logical value of the second bit of plural bits of said address signal in accordance with information held in said information holding part, and said decoder generates said selection signal in a manner that only memory cells having said gate terminal connected only to at least one of said plurality of word lines are used.

5. A nonvolatile semiconductor memory device as claimed in claim 2, wherein said mode setting part fixes logical values respectively of the first and second bits of plural bits of said address signal in accordance with information held in said information holding part, and said decoder generates said selection signal in a manner that only memory cells having said gate terminal connected only to at least one of said plurality of word lines are used and that connections relating to said bit lines are limited to use only one of said charge accumulation portion on said drain terminal side and said charge accumulation portion on said source terminal side in each of said plurality of memory cells.

6. A nonvolatile semiconductor memory device as claimed in claim 1, wherein said information holding part is a cell fuse made of a memory of which said information is rewritable.

7. A nonvolatile semiconductor memory device as claimed in claim 1, wherein said information holding part is a memory of a part of said memory cell array.

8. A nonvolatile semiconductor memory device having a memory cell array arranged in matrix form, comprising:
a decoder for generating, to said memory cell array, a selection signal to designate at least a read address of said memory cell array in accordance with an address signal that comprises plural bits;
an information holding part which holds information that indicates an operation mode of said memory cell array; and
a mode setting part which fixes a logical value of at least one bit of said plural bits of said address signal in accordance with the information held by said information holding part, and supplies said address signal, on which fixing of the logical value is effected, to said decoder,
wherein said memory array comprises:
a plurality of word lines;
a plurality of memory cells each having an nMOSFET structure and having a charge accumulation portion on each of a drain terminal side and a source terminal side, and a gate terminal connected to each of said word lines; and
a plurality of bit lines, and wherein data is recorded by injecting electric charges into said charge accumulation portion of each of said plurality of memory cells, and
wherein, when information held in said information holding part indicates a first mode as said operation mode, said mode setting part fixes a logical value of a first bit of plural bits of said address signal in accordance with the information held in said information holding part, and said decoder generates said selection signal in a manner that connections relating to said bit lines are limited to use only one of said charge accumulation portion on said drain terminal side and said charge accumulation portion on said source terminal side in each of said plurality of memory cells,
when the information held in said information holding part indicates a second mode as said operation mode, said mode setting part fixes a logical value of a second bit of plural bits of said address signal in accordance with the information held in said information holding part, and said decoder generates said selection signal in a manner that only memory cells having said gate terminal connected only to at least one of said plurality of word lines are used,
when the information held in said information holding part indicates a third mode as said operation mode, said mode setting part fixes logical values respectively of first and second bits of plural bits of said address signal in accordance with the information held in said information holding part, and said decoder generates said selection signal in a manner that only memory cells having said gate terminal connected only to at least one of said plurality of word lines are used and that connections relating to said bit lines are limited to use only one of said charge accumulation portion on said drain terminal side and said charge accumulation portion on said source terminal side in each of said plurality of memory cells.

9. A nonvolatile semiconductor memory device as claimed in claim 8, wherein, when the information held in said information holding part indicates the second mode as said operation mode, said decoder generates said selection signal in a manner that only memory cells having said gate terminal connected only to half of said plurality of word lines are used, and when the information held in said information holding part indicates the third mode as said operation mode, said decoder generates said selection signal in a manner that only memory cells having said gate terminal connected only to half of said plurality of word lines are used and that connections relating to said bit lines are limited to use only one of said charge accumulation portion on said drain terminal side and said charge accumulation portion on said source terminal side in each of said plurality of memory cells.

10. A method for reusing a nonvolatile semiconductor memory having a plurality of memory cells, information holding means for indicating at least one of a used region and a unused region of said plurality of memory cells as holding information, and control means for rendering only said used region of said plurality of memory cells at least readable, in accordance with said holding information of said information holding means, said method comprising:
- a step for reading said holding information of said information holding means,
- a step of discriminating between said used region and said unused region of said plurality of memory cells in accordance with the holding information having been read;
- a step for erasing data of said used region of said plurality of memory cells,
- a step for altering said holding information of said information holding means to change said unused region of said plurality of memory cells to a used region, and
- a step for writing data into said unused region of said plurality of memory cells after execution of said step for erasing data of said used region of said plurality of memory cells.

11. A nonvolatile semiconductor memory device having a memory cell array arranged in matrix form, comprising:
- a decoder for generating, to said memory cell array, a selection signal to designate at least a read address of said memory cell array in accordance with an address signal that comprises plural bits;
- information holding means for holding information that indicates one of a plurality of operation modes of said memory cell array; and
- mode setting means for selecting said one of said plurality of operation modes by fixing a logical value of at least one bit of a first bit and a second bit of said address signal in accordance with the information held by said information holding means, and supplying said address signal, on which fixing of the logical value is effected, to said decoder thereby to use said one of a plurality of operation modes, said first bit of said address signal carrying information for selecting one of a drain terminal side and a source terminal side of a plurality of memory cells of said memory cell array, and said second bit of said address signal carrying information for selecting one of a plurality of word lines of said memory cell array.

12. A nonvolatile semiconductor memory device as claimed in claim 11, wherein said memory array comprises:
- a plurality of word lines;
- a plurality of memory cells each having an nMOSFET structure and having a charge accumulation portion on each of a drain terminal side and a source terminal side, and a gate terminal connected to each of said word lines; and
- a plurality of bit lines, and wherein data is recorded by injecting electric charges into said charge accumulation portion of each of said plurality of memory cells.

13. A nonvolatile semiconductor memory device as claimed in claim 12, wherein said mode setting means fixes said logical value of said first bit of plural bits of said address signal in accordance with information held in said information holding means, and said decoder generates said selection signal in a manner that connections relating to said bit lines are limited to use only one of said charge accumulation portion on said drain terminal side and said charge accumulation portion on said source terminal side in each of said plurality of memory cells.

14. A nonvolatile semiconductor memory device as claimed in claim 12, wherein said mode setting means fixes said logical value of said second bit next to a first bit of plural bits of said address signal in accordance with information held in said information holding means, and said decoder generates said selection signal in a manner that only memory cells having said gate terminal connected only to at least one of said plurality of word lines are used.

15. A nonvolatile semiconductor memory device as claimed in claim 12, wherein said mode setting means fixes logical values respectively of said first and second bits of plural bits of said address signal in accordance with information held in said information holding means, and said decoder generates said selection signal in a manner that only memory cells having said gate terminal connected only to at least one of said plurality of word lines are used and that connections relating to said bit lines are limited to use only one of said charge accumulation portion on said drain terminal side and said charge accumulation portion on said source terminal side in each of said plurality of memory cells.

16. A nonvolatile semiconductor memory device as claimed in claim 12, wherein, when information held in said information holding means indicates a first mode as said operation mode, said mode setting means fixes said logical value of said first bit of plural bits of said address signal in accordance with the information held in said information holding means, and said decoder generates said selection signal in a manner that connections relating to said bit lines are limited to use only one of said charge accumulation portion on said drain terminal side and said charge accumulation portion on said source terminal side in each of said plurality of memory cells,
- when the information held in said information holding means indicates a second mode as said operation mode, said mode setting means fixes said logical value of said second bit of plural bits of said address signal in accordance with the information held in said information holding means, and said decoder generates said selection signal in a manner that only memory cells having said gate terminal connected only to at least one of said plurality of word lines are used,
- when the information held in said information holding means indicates a third mode as said operation mode, said mode setting means fixes logical values respectively of said first and second bits of plural bits of said address signal in accordance with the information held in said information holding means, and said decoder generates said selection signal in a manner that only memory cells having said gate terminal connected only to at least one of said plurality of word lines are used and that connections relating to said bit lines are limited to use only one of said charge accumulation portion on said drain terminal side and said charge accumulation portion on said source terminal side in each of said plurality of memory cells.

17. A nonvolatile semiconductor memory device as claimed in claim 16, wherein, when the information held in said information holding means indicates the second mode as said operation mode, said decoder generates said selection signal in a manner that only memory cells having said gate terminal connected only to half of said plurality of word lines are used, and when the information held in said information holding means indicates the third mode as said operation mode, said decoder generates said selection signal in a manner that only memory cells having said gate terminal connected only to half of said plurality of word lines are used and that connections relating to said bit lines are limited to use only one of said charge accumulation portion on said drain terminal side and said charge accumulation portion on said source terminal side in each of said plurality of memory cells.

18. A nonvolatile semiconductor memory device as claimed in claim 11, wherein said information holding means is a cell fuse made of a memory of which said information is rewritable.

19. A nonvolatile semiconductor memory device as claimed in claim 11, wherein said information holding means is a memory of a part of said memory cell array.

* * * * *